(12) United States Patent
Yanagisawa et al.

(10) Patent No.: US 12,225,806 B2
(45) Date of Patent: Feb. 11, 2025

(54) DISPLAY DEVICE

(71) Applicant: Japan Display Inc., Tokyo (JP)

(72) Inventors: Sho Yanagisawa, Tokyo (JP); Tetsuo Morita, Tokyo (JP); Kenji Harada, Tokyo (JP); Hiroshi Tabatake, Tokyo (JP); Hideyuki Takahashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 785 days.

(21) Appl. No.: 17/451,502

(22) Filed: Oct. 20, 2021

(65) Prior Publication Data

US 2022/0157899 A1 May 19, 2022

(30) Foreign Application Priority Data

Nov. 17, 2020 (JP) ................. 2020-190930

(51) Int. Cl.
*H01L 27/32* (2006.01)
*H10K 59/122* (2023.01)
*H10K 59/131* (2023.01)
*H10K 59/88* (2023.01)

(52) U.S. Cl.
CPC ........... *H10K 59/88* (2023.02); *H10K 59/122* (2023.02); *H10K 59/131* (2023.02)

(58) Field of Classification Search
None
See application file for complete search history.

(56) References Cited

U.S. PATENT DOCUMENTS

| 2004/0160170 A1 | 8/2004 | Sato et al. |
| 2009/0009069 A1 | 1/2009 | Takata |
| 2013/0001620 A1* | 1/2013 | Sugisawa ............. H10K 59/122 257/E33.062 |
| 2015/0090993 A1* | 4/2015 | Tokuda ................. H10K 59/10 438/23 |
| 2017/0186831 A1 | 6/2017 | Nam et al. |
| 2019/0363275 A1 | 11/2019 | Ochi et al. |
| 2019/0393284 A1 | 12/2019 | Li et al. |

(Continued)

FOREIGN PATENT DOCUMENTS

| CN | 110212001 A | 9/2019 |
| JP | 2000-195677 A | 7/2000 |
| JP | 2004-207217 A | 7/2004 |

(Continued)

OTHER PUBLICATIONS

Office Action issued on May 7, 2024, in corresponding Japanese Application No. 2020-190930, 6 pages.

*Primary Examiner* — William C Trapanese
(74) *Attorney, Agent, or Firm* — Maier & Maier, PLLC (57) ABSTRACT

According to one embodiment, a display device includes a substrate, first and second insulating layers, first and second pixel electrodes, first and second organic layers, first and second feed lines, first and second partitions, and a common electrode including first and second parts covering the first and second organic layers. The first organic layer is between the partitions. The second feed line and the second partition are located between the organic layers. The partitions are shaped such that a width of an upper part is greater than a width of a lower part. The first part is in contact with the first feed line between the first partition and the first organic layer.

18 Claims, 6 Drawing Sheets

(56) References Cited

U.S. PATENT DOCUMENTS

2019/0393445 A1    12/2019   Lee et al.
2021/0043715 A1*    2/2021   Han .................... H10K 50/844

FOREIGN PATENT DOCUMENTS

| JP | 2008-135325 A | 6/2008 |
| JP | 2009-032673 A | 2/2009 |
| JP | 2010-118191 A | 5/2010 |
| JP | 2017120782 A | 7/2017 |
| WO | WO 2018/179308 A1 | 10/2018 |

* cited by examiner

DISPLAY DEVICE

CROSS-REFERENCE TO RELATED APPLICATIONS

This application is based upon and claims the benefit of priority from Japanese Patent Application No. 2020-190930, filed Nov. 17, 2020, the entire contents of which are incorporated herein by reference.

FIELD

Embodiments described herein relate generally to a display device.

BACKGROUND

Recently, a display device employing an organic light-emitting diode (OLED) as a display element has been put into practical use. This display element comprises a pixel electrode, a common electrode, and an organic layer arranged between the pixel electrode and the common electrode.

When elements such as an electrode and a wiring line which are arranged repeatedly in a display region are patterned, the shapes of those which are located on the outermost periphery may not be as designed. For example, when the pixel electrode of each pixel is patterned by etching, the outermost peripheral pixel electrode may be excessively eroded. When such a shape defect occurs, the display quality of the display device is reduced.

DETAILED DESCRIPTION

In general, according to one embodiment, there is provided a display device comprising a substrate, a first insulating layer, a first pixel electrode, a second pixel electrode, a second insulating layer, a first organic layer, a second organic layer, a first feed line, a second feed line, a first partition, a second partition and a common electrode. The first insulating layer is arranged on the substrate. The first pixel electrode is arranged on the first insulating layer in a pixel located in a display region. The second pixel electrode is arranged on the first insulating layer in a dummy pixel located in a surrounding region outside the display region. The second insulating layer is arranged on the first insulating layer, and has an opening overlapping the first pixel electrode. The first organic layer is arranged in the pixel, and is in contact with the first pixel electrode through the opening. The second organic layer is arranged in the dummy pixel. The first feed line and the second feed line are arranged on the second insulating layer. The first partition is arranged on the first feed line. The second partition is arranged on the second feed line. The common electrode includes a first part covering the first organic layer and a second part covering the second organic layer. The first organic layer is located between the first partition and the second partition, and is separated from the first partition and the second partition. The second feed line and the second partition are located between the first organic layer and the second organic layer. The first partition and the second partition each are shaped such that a width of an upper part is greater than a width of a lower part. The first part is in contact with the first feed line between the first partition and the first organic layer.

According to the above configuration, a display device capable of improving display quality can be provided.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, constituent elements which function in the same or a similar manner to those described in connection with preceding drawings are denoted by the same reference numbers, and detailed descriptions thereof which are considered redundant are omitted where appropriate.

In the drawings, in order to facilitate understanding, an X-axis, a Y-axis and a Z-axis which are orthogonal to one another may be shown when needed. A direction along the X-axis is referred to as an X-direction or a first direction, a direction along the Y-axis is referred to as a Y-direction or a second direction, and a direction along the Z-axis is referred to as a Z-direction or a third direction. A plane defined by the X-axis and the Y-axis is referred to as an X-Y plane, and a plane defined by the X-axis and the Z-axis is referred to as an X-Z plane. Viewing the X-Y plane is referred to as planar view.

A display device DSP according to the present embodiment is an organic electroluminescent display device comprising an organic light-emitting diode (OLED) as a display element, and is mounted in a television set, a personal computer, a vehicle-mounted device, a portable device, a mobile telephone or the like.

First Embodiment

Figure 1:
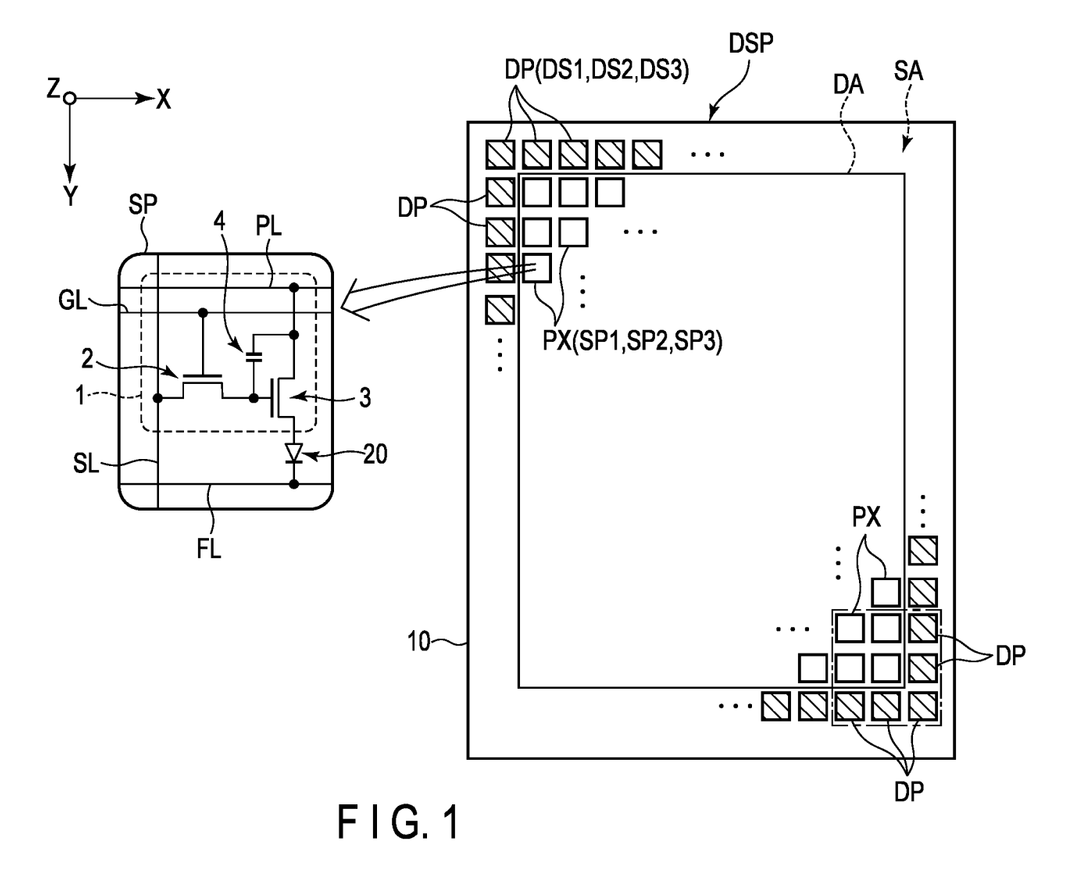
FIG. 1 is an illustration showing a configuration example of a display device according to the first embodiment.

FIG. 1 is an illustration showing a configuration example of a display device DSP according to the first embodiment. The display device DSP has a display region DA for displaying an image and a surrounding region SA outside the display region DA on an insulating substrate 10. The substrate 10 may be a glass or a resin film having flexibility.

The display region DA comprises a plurality of pixels PX arranged in a matrix in the first direction X and the second direction Y. Each pixel PX comprises a plurality of subpixels SP. In one example, the pixel PX comprises a red subpixel SP1, a green subpixel SP2 and a blue subpixel SP3. It should be noted that the pixel PX may comprise four or more subpixels including a subpixel of another color such as white in addition to the subpixels of these three colors.

Each subpixel SP comprises a pixel circuit 1 and a display element 20 driven and controlled by the pixel circuit 1. The pixel circuit 1 comprises a pixel switch 2, a drive transistor 3 and a capacitor 4. The pixel switch 2 and the drive transistor 3 each are a switching element composed of a thin-film transistor, for example.

In the pixel switch 2, a gate electrode is connected to a scanning line GL, a source electrode is connected to a signal line SL, and a drain electrode is connected to one electrode constituting the capacitor 4 and a gate electrode of the transistor 3. In the drive transistor 3, a source electrode is connected to the other electrode constituting the capacitor 4 and a power line PL, and a drain electrode is connected to an anode of the display element 20. A cathode of the display element 20 is connected to a feed line (auxiliary wiring line) to which a common voltage is supplied. It should be noted that the configuration of the pixel circuit 1 is not limited to the illustrated example.

The display element 20 is an organic light-emitting diode (OLED) as a display element. For example, the subpixel SP1 comprises a display element which emits light corresponding to a red wavelength, the subpixel SP2 comprises a display element which emits light corresponding to a green wavelength, and the subpixel SP3 comprises a display element which emits light corresponding to a blue wavelength. The configuration of the display element 20 will be described later.

The surrounding region SA comprises a plurality of dummy pixels DP which do not display any image. For example, the dummy pixels DP surround the display region DA. That is, the dummy pixels DP are located between the outermost peripheral pixels PX and the respective sides of the substrate 10.

Each dummy pixel DP comprises a plurality of dummy subpixels DS. In one example, the dummy pixel DP comprises a dummy subpixel DS1 having a similar structure to the subpixel SP1, a dummy subpixel DS2 having a similar structure to the subpixel SP2, and a dummy subpixel DS3 having a similar structure to the subpixel SP3.

Figure 2:
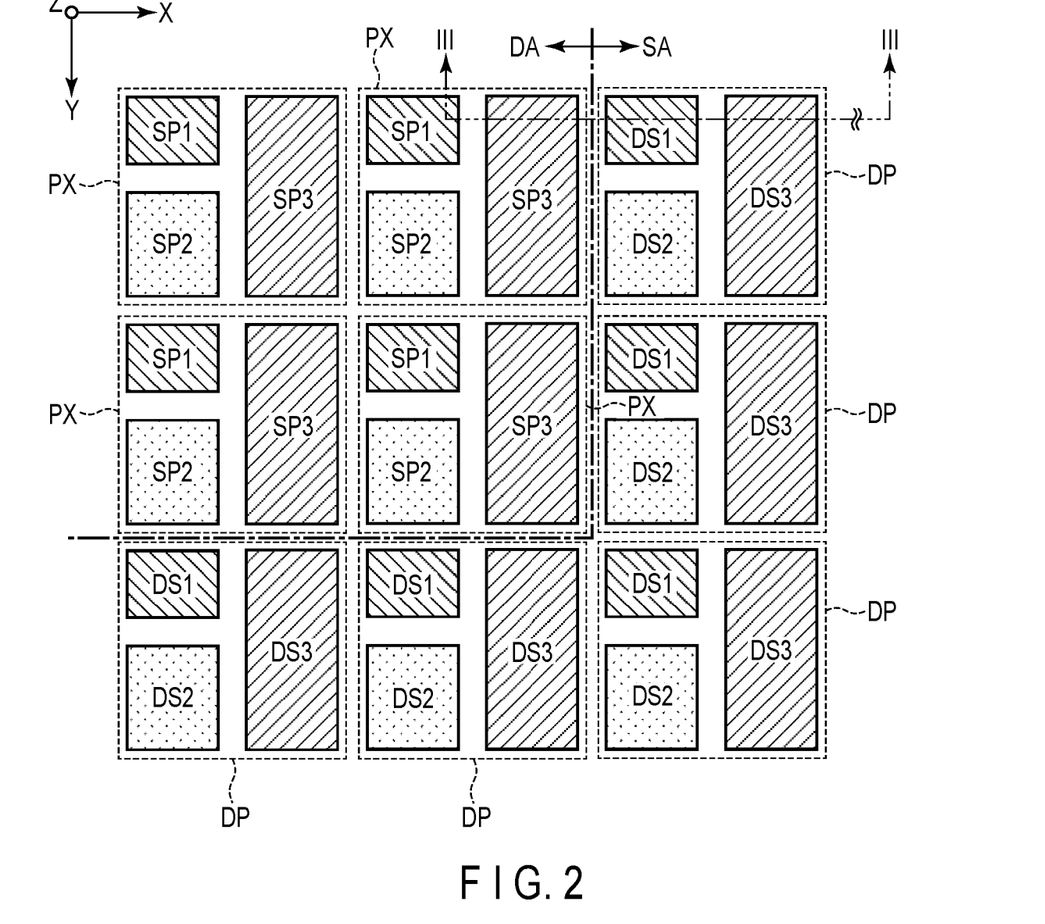
FIG. 2 is an illustration showing an example of a layout of subpixels and dummy subpixels.

FIG. 2 is an illustration showing an example of a layout of the subpixels SP1, SP2 and SP3 and the dummy subpixels DS1, DS2 and DS3. Here focuses on four pixels PX and surrounding five dummy pixels DP enclosed by a dashed-dotted line in FIG. 1.

In each pixel PX, the subpixel SP1 and the subpixel SP2 are arranged in the second direction Y, the subpixel SP1 and the subpixel SP3 are arranged in the first direction X, and the subpixel SP2 and the subpixel SP3 are arranged in the first direction X. The subpixel SP1 is formed in a substantially rectangular shape extending in the first direction X, the subpixel SP2 and the subpixel SP3 are formed in a substantially rectangular shape extending in the second direction Y. The area of the subpixel SP2 is greater than the area of the subpixel SP1, and the area of the subpixel SP3 is greater than the area of the subpixel SP2. It should be noted that the area of the subpixel SP1 may be the same as the area of the subpixel SP2.

When attention is focused on the pixels PX arranged in the display region DA, the subpixel SP1 and the subpixel SP3 are arranged alternately in the first direction X. The subpixel SP2 and the subpixel SP3 are also arranged alternately in the first direction X. In addition, the subpixel SP1 and the subpixel SP2 are arranged alternately in the second direction Y. The subpixels SP3 are arranged without the intervention of the subpixels SP1 and SP2 in the second direction Y.

The dummy subpixel DS1 has the same shape as the subpixel SP1, the dummy subpixel DS2 has the same shape as the subpixel SP2, and the dummy subpixel DS3 has the same shape as the subpixel SP3. The way the dummy subpixels DS1, DS2 and DS3 are arranged in the dummy pixel DP is the same as the way the subpixels SP1, SP2 and SP3 are arranged in the pixel PX.

The outer shapes of the subpixels SP1, SP2 and SP3 and the dummy subpixels DS1, DS2 and DS3 shown in FIG. 2 correspond to the outer shape of the pixel electrode of the display element or the emitting region of the display element. However, these shapes are simplified, and do not necessarily reflect the actual shapes. In addition, the shapes of the dummy subpixels DS1, DS2 and DS3 only need to be similar to the shapes of the subpixels SP1, SP2 and SP3, and are not necessarily limited to the same shapes.

Figure 3:
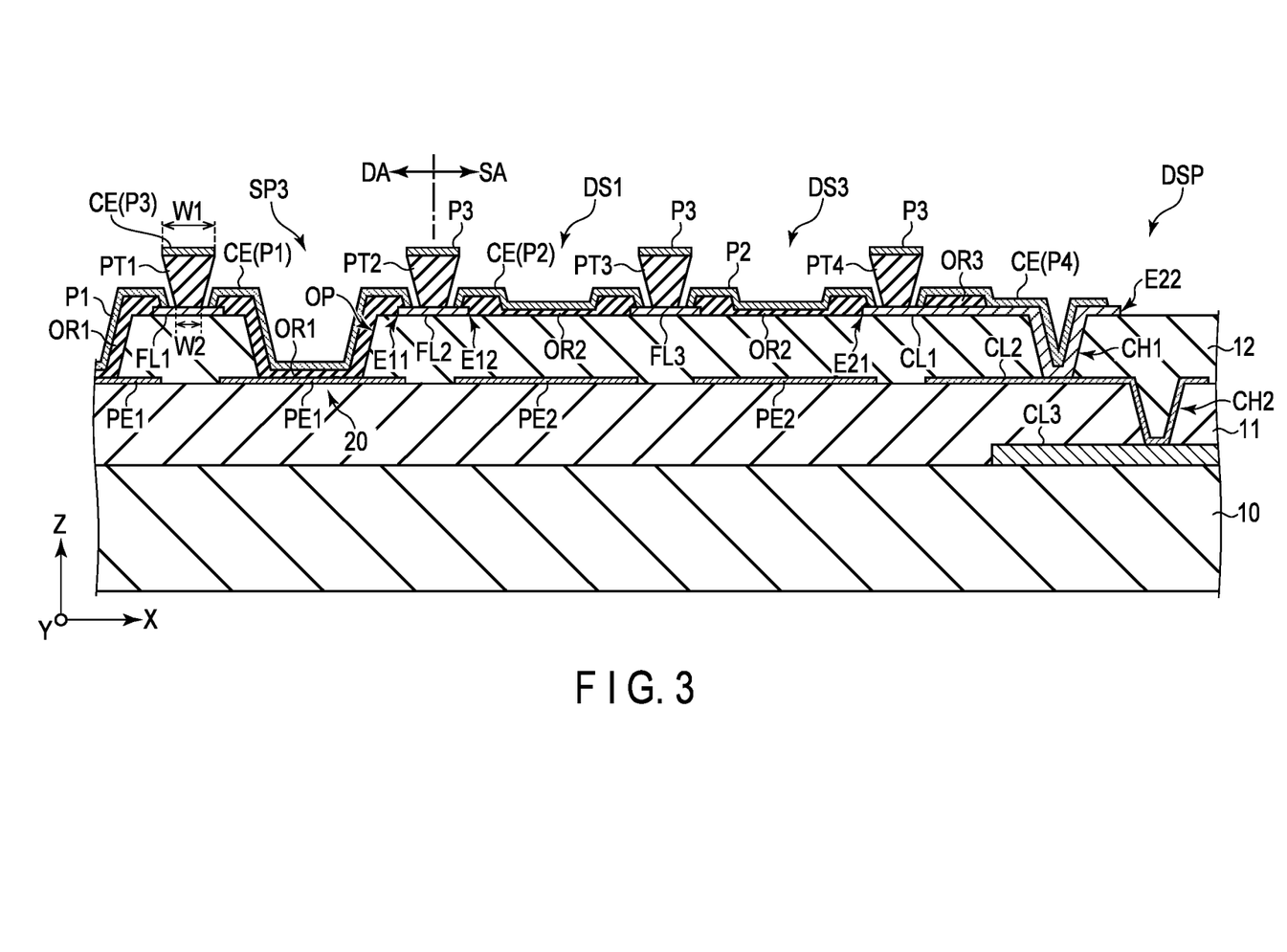
FIG. 3 is a schematic cross-sectional view of the display device along line of FIG. 2.

FIG. 3 is a schematic cross-sectional view of the display device DSP along line of FIG. 2. The display device DSP comprises an insulating layer 11 (first insulating layer) arranged on the substrate 10, and an insulating layer 12 (second insulating layer) arranged on the insulating layer 11. The pixel circuit 1, the scanning line GL, the signal line SL and the power line PL shown in FIG. 1 are arranged on the substrate 10 and are covered with the insulating layer 11, but illustrations thereof are omitted here. The insulating layers 11 and 12 each are, for example, an organic insulating layer. The insulating layer 11 may be referred to also as an underlayer of the display element 20. The insulating layer 12 is formed so as to delimit the display element 20 or the subpixel SP, and may be referred to also as a rib or a partition.

As in the subpixel SP3 shown in FIG. 3, the display element 20 of each subpixel SP comprises a pixel electrode PE1 (first pixel electrode), an organic layer OR1 (first organic layer) and a common electrode CE. The pixel electrode PE1 is an electrode arranged for each subpixel SP or each display element 20, and may be referred to also as a lower electrode, an anode or the like. The common electrode CE is an electrode arranged common to the subpixels SP or the display elements 20, and may be referred to also as a counter electrode, an upper electrode, a cathode or the like.

The pixel electrode PE1 is arranged on the insulating layer 11, and a peripheral part thereof is covered with the insulating layer 12. The pixel electrode PE1 is electrically connected to the drive transistor 3 shown in FIG. 1. The pixel electrode PE1 is, for example, a transparent electrode formed of a transparent conductive material such as indium tin oxide (ITO) or indium zinc oxide (IZO). It should be noted that the pixel electrode PE1 may be a metal electrode formed of a metal material such as silver or aluminum. In addition, the pixel electrode PE1 may be a layer stack of a transparent electrode and a metal electrode. For example, the pixel electrode PE1 may be composed as a layer stack of a transparent electrode, a metal electrode and a transparent electrode stacked in order or may be composed as a layer stack of more than three layers.

The insulating layer 12 has an opening OP overlapping the pixel electrode PE1 in each subpixel SP. The organic layer OR1 is arranged on the insulating layer 12, and is in contact with the pixel electrode PE1 through the opening OP.

Figure 4:
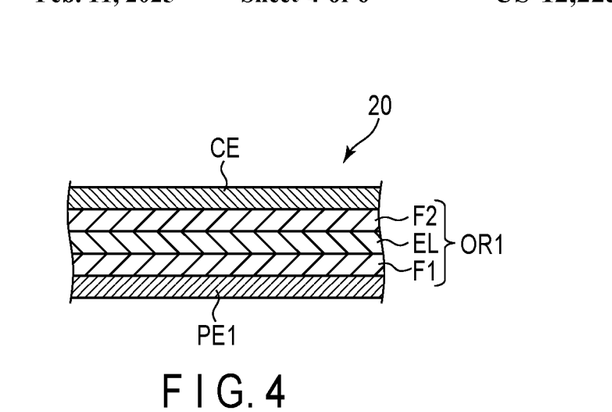
FIG. 4 is a cross-sectional view showing an example of a layer configuration applicable to an organic layer.

FIG. 4 is a cross-sectional view showing an example of a layer configuration applicable to the organic layer OR1. For example, the organic layer OR1 includes a functional layer F1, an emitting layer EL and a functional layer F2 stacked in order from the pixel electrode PE1 toward the common electrode CE. The functional layers F1 and F2 each are, for example, a hole injection layer, a hole transport layer, a hole blocking layer, an electron injection layer, an electron transport layer or an electron blocking layer, but may be another functional layer. The functional layers F1 and F2 each are not limited to a single layer but may be a layer stack of a plurality of functional layers. In addition, at least one of the functional layers F1 and F2 may be omitted.

As shown in FIGS. 3 and 4, the common electrode CE covers the organic layer OR1. The common electrode CE is a transparent electrode formed of a transparent conductive material such as ITO or IZO, for example. The common electrode CE may be covered with a transparent protective film (including at least one of an inorganic insulating film and an organic insulating film).

When the potential of the pixel electrode PE1 is relatively higher than the potential of the common electrode CE, the pixel electrode PE1 corresponds to an anode, and the common electrode CE corresponds to a cathode. In addition, when the potential of the common electrode CE is relatively higher than the potential of the pixel electrode PE1, the common electrode CE corresponds to an anode, and the pixel electrode PE1 corresponds to a cathode.

In one example, when the pixel electrode PE1 corresponds to an anode, and the functional layer F1 includes at least one of a hole injection layer and a hole transport layer, and the functional layer F2 includes at least one of an electron transport layer and an electron injection layer.

As in the dummy subpixels DS1 and DS3 shown in FIG. 3, the dummy subpixel DS includes a pixel electrode PE2 (second pixel electrode) and an organic layer OR2 (second organic layer). The pixel electrode PE2 is arranged on the insulating layer 11 and is covered with the insulating layer 12 as is the case with the pixel electrode PE1. The pixel electrode PE2 is formed of the same material as the pixel electrode PE1 in the same process as the pixel electrode PE1. The organic layer OR2 is arranged on the insulating layer 12 and is covered with the common electrode CE as is the case with the organic layer OR1. The organic layer OR2 has the same structure as the organic layer OR1, and includes the emitting layer EL and the functional layers F1 and F2 in one example.

In the example of FIG. 3, the insulating layer 12 does not have any opening in the dummy subpixel DS. Accordingly, the pixel electrode PE2 and the organic layer OR2 of each dummy subpixel DS are opposed to each other via the insulating layer 12. In the dummy subpixel DS having this configuration, even when a potential difference is formed between the pixel electrode PE2 and the common electrode CE, the organic layer OR2 does not emit light.

The dummy subpixel DS may comprise the same pixel circuit 1 as the subpixel SP. This pixel circuit 1 may be connected to the pixel electrode PE2 or may not be connected to the pixel electrode PE2. When the dummy subpixel DS comprises the pixel circuit 1, this pixel circuit 1 can protect the pixel circuit 1 of the subpixel SP from electrostatic discharge caused in the manufacturing process or the like of the display device DSP.

A feed line FL and a partition PT are arranged between the organic layers OR1 arranged in two adjacent subpixels SP, between the organic layer OR1 arranged in the subpixel SP and the organic layer OR2 arranged in the dummy subpixel DS arranged adjacent to this subpixel SP, and between the organic layers OR2 arranged in two adjacent dummy subpixels DS. In the example of FIG. 3, the partition PT is also arranged on the right side of the dummy subpixel DS3. The feed line FL is formed of a metal material. The partition PT is an organic insulating layer, for example.

In the following description, three feed lines FL shown in FIG. 3 may be referred to as a feed line FL1 (first feed line), a feed line FL2 (second feed line) and a feed line FL3 (third feed line) in order from the left side. In addition, four partitions PT shown in FIG. 3 may be referred to as a partition PT1 (first partition), a partition PT2 (second partition), a partition PT3 (third partition) and a partition PT4 (fourth partition) in order from the left side.

The partition PT1 is arranged on the feed line FL1. The partition PT2 is arranged on the feed line FL2. The partition PT3 is arranged on the feed line FL3. The partition PT4 is arranged on a conductive layer CL1 (first conductive layer). The conductive layer CL1 is arranged on the insulating layer 12, and is formed of the same metal material as each feed line FL in the same process as each feed line FL.

Each partition PT has a reverse tapered shape. Here, the reverse tapered shape means such a shape that a width W1 of an upper part is greater than a width W2 of a lower part as the partition PT1 is illustrated in FIG. 3. The side surface of the partition PT may be a flat surface or a curved surface inclined with respect to the third direction Z. In addition, the partition PT may be composed of a plurality of parts the widths of which become smaller stepwise from the upper part toward the lower part.

The organic layer OR1 of the subpixel SP3 is located between the partition PT1 and the partition PT2, and is separated from the partition PT1 and the partition PT2. The organic layer OR2 of the dummy subpixel DS1 is located between the partition PT2 and the partition PT3, and is separated from the partition PT2 and the partition PT3. The organic layer OR2 of the dummy subpixel DS3 is located between the partition PT3 and the partition PT4, and is separated from the partition PT3 and the partition PT4.

The width of the feed line FL is greater than the width W2 of the lower part of the partition PT. Furthermore, in the example of FIG. 3, the width of the feed line FL is greater than the width W1 of the upper part of the partition PT. Both end parts of the feed line FL protrude from the partition PT arranged on the feed line FL. That is, when attention is focused on, for example, the second feed line FL2, the second feed line FL2 has a first end part E11 close to the organic layer OR1 of the subpixel SP3 and a second end part El2 close to the organic layer OR2 of the dummy subpixel DS1. The first end part E11 protrudes toward the organic layer OR1 from the partition PT2, and is not covered with the partition PT2. The second end part E12 protrudes toward the organic layer OR2 from the partition PT2, and is not covered with the partition PT2. The first end part E11 is covered with the organic layer OR1. The second end part El2 is covered with the organic layer OR2. A gap is formed between the first end part E11 and the organic layer OR1. A gap is formed between the second end part El2 and the organic layer OR2. Depending on the conditions of the width W1 and the height of the upper part of the partition PT and the width of the feed line FL, the organic layer OR may not cover the end part of the feed line FL.

The conductive layer CL1 has a first end part E21 close to the organic layer OR2 arranged in the dummy subpixel DS3, and a second end part E22 arranged opposite to the first end part E21. These end parts E21 and E22 are not covered with the partition PT4.

The common electrode CE is formed over the entire region including the subpixel SP and the dummy subpixel DS by, for example, vapor deposition. At this time, the organic layers OR1 and OR2 and the upper part of the partition PT are covered with the common electrode CE. In the example of FIG. 3, the conductive layer CL1 is also covered with the common electrode CE. On the other hand, since the partition PT has the above-described reverse tapered shape, the common electrode CE is hardly formed on the side surface of the partition PT. Therefore, the common electrode CE is divided at the position of the partition PT.

Here, a part of the common electrode CE which covers the organic layer OR1 is referred to as a first part P1, a part of the common electrode CE which covers the organic layer OR2 is referred to as a second part P2, and a part of the common electrode CE which covers the upper part of the partition PT is referred to as a third part P3, and a part of the common electrode CE which covers the conductive layer CL1 is referred to as a fourth part P4. The third part P3 is separated from the first part P1, the second part P2 and the fourth part P4.

As shown in FIG. 3, the first part P1 covering the organic layer OR1 of the subpixel SP3 is in contact with the feed line FL1 through a gap between the partition PT1 and the organic layer OR1. Furthermore, this first part P1 is in contact with the feed line FL2 through a gap between the partition PT2 and the organic layer OR1. The other subpixels SP have the same structure as the subpixel SP3 shown in FIG. 3.

The second part P2 covering the organic layer OR2 of the dummy subpixel DS1 is in contact with the feed line FL2 through a gap between the partition PT2 and the organic layer OR2. Furthermore, this second part P2 is in contact with the feed line FL3 through a gap between the partition PT3 and the organic layer OR2. The second part P2 covering the organic layer OR2 of the dummy subpixel DS3 is in contact with the feed line FL3 through a gap between the partition PT3 and the organic layer OR2. Furthermore, this second part P2 is in contact with the conductive layer CL1 through a gap between the partition PT4 and the organic layer OR2. The other dummy subpixels DS have the same structure as the dummy subpixel DS1 or the dummy subpixel DS3 shown in FIG. 3.

The display device DSP further comprises a conductive layer CL2 (second conductive layer) arranged between the insulating layers 11 and 12, and a conductive layer CL3 (third conductive layer) arranged between the substrate 10 and the insulating layer 11. In the surrounding region SA, the insulating layer 12 has a contact hole CH1 (first contact hole), and the insulating layer 11 has a contact hole CH2 (second contact hole). For example, the conductive layer CL2 is formed of the same material as the pixel electrodes PE1 and PE2 in the same process as the pixel electrodes PE1 and PE2.

The conductive layer CL1 is in contact with the conductive layer CL2 through the contact hole CH1. The conductive layer CL2 is in contact with the conductive layer CL3 through the contact hole CH2. A common voltage is supplied to the conductive layer CL3. This common voltage is supplied to the first part P1, the second part P2 and the fourth part P4 of the common electrode CE via the conductive layer CL2, the conductive layer CL1 and the feed lines FL.

In the example of FIG. 3, an organic layer OR3 is arranged on the conductive layer CL1. The organic layer OR3 is covered with the fourth part P4. For example, the above-described emitting layers EL of the organic layers OR1 and OR2 are formed individually for the colors of the subpixel SP and the dummy subpixel DS. On the other hand, at least parts of the layers included in the above-described functional layers F1 and F2 are formed simultaneously over the entire region including the subpixel SP and the dummy subpixel DS. For example, the organic layer OR3 is a part in which a layer (common layer) formed simultaneously in each subpixel SP and each dummy subpixel DS 1 is divided by the partition PT4. In this case, the organic layer OR3 may not include the emitting layer EL.

It should be noted that at least parts of the layers constituting the organic layers OR1 and OR2 may be arranged on the upper parts of the partitions PT. For example, when the emitting layer EL and the functional layers F1 and F2 are formed in a range overlapping the partition PT, parts of the emitting layer EL and the functional layers F1 and F2 are arranged between the upper part of the partition PT and the third part P3. Since the partition PT has a reverse tapered shape, these parts are divided from the organic layers OR1 and OR2.

Figure 5:
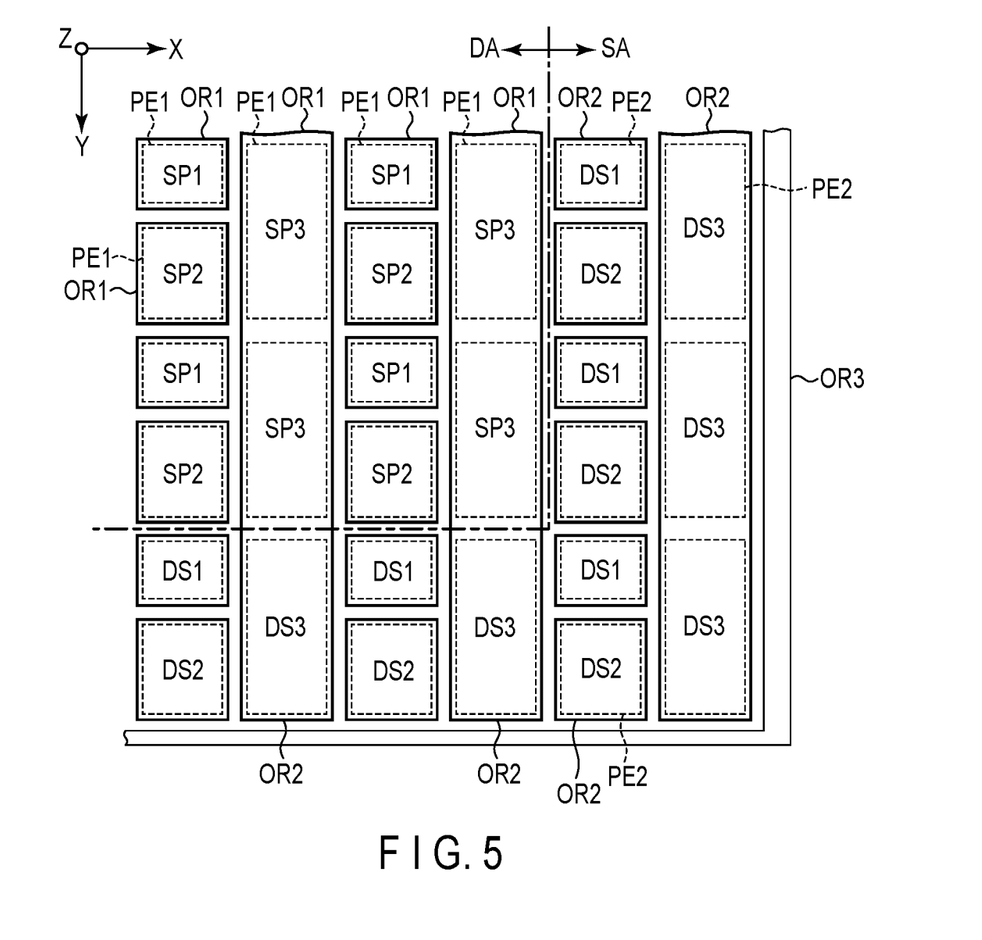
FIG. 5 is a schematic plan view of pixel electrodes and the organic layers shown in FIG. 3.

FIG. 5 is a schematic plan view of the pixel electrodes PE1 and PE2 and the organic layers OR1, OR2 and OR3. The pixel electrodes PE1 are arranged in the subpixels SP1, SP2 and SP3 respectively and separately from one another. These pixel electrodes PE1 overlap the above-described openings OP. The pixel electrodes PE2 are arranged in the dummy subpixels DS1, DS2 and DS3 respectively and separately from one another.

The organic layers OR1 overlap the pixel electrodes PE1 respectively in the subpixels SP1, SP2 and SP3. In the example of FIG. 5, the continuous organic layer OR1 is arranged over the subpixels SP3 arranged in the second direction Y.

The organic layers OR2 overlap the pixel electrodes PE2 respectively in the dummy subpixels DS1, DS2 and DS3. In the example of FIG. 5, the continuous organic layer OR2 is arranged over the dummy subpixels DS3 arranged in the second direction Y. The organic layer OR2 of the dummy pixel DS3 adjacent in the second direction Y to the subpixel SP3 is continuous with the organic layer OR1 of this subpixel SP3.

The organic layer OR3 has a part extending in the first direction X and a part extending in the second direction Y. For example, the organic layer OR3 is formed in an annular shape in the surrounding region SA. The dummy subpixels DS1, DS2 and DS3 are located between the display region DA and the organic layer OR3.

Figure 6:
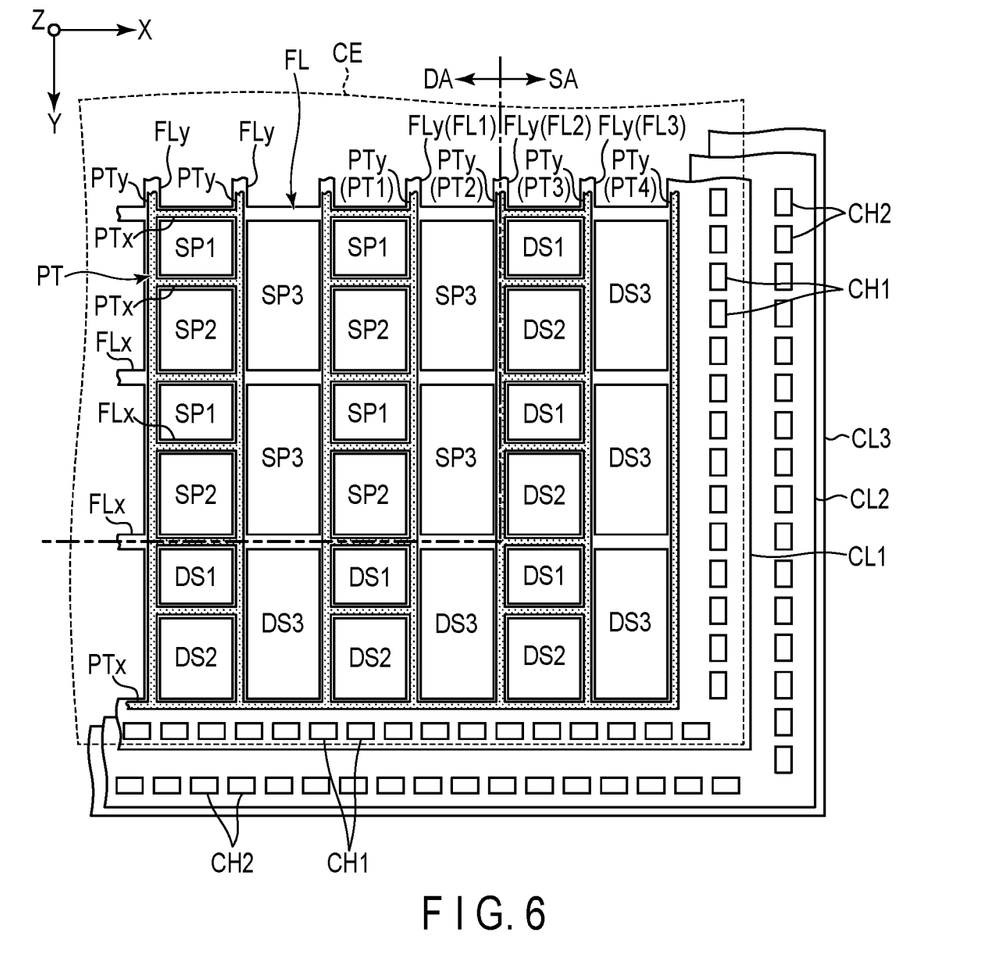
FIG. 6 is a schematic plan view of feed lines, partitions, a common electrode and conductive layers shown in FIG. 3.

FIG. 6 is a schematic plan view of the feed lines FL, the partitions PT, the common electrode CE and the conductive layers CL1, CL2 and CL3. The feed lines FL include a feed line FLx extending in the first direction X and a feed line FLy extending in the second direction Y.

The feed lines FLx and FLy are arranged between two adjacent subpixels SP, between two adjacent dummy subpixels DS and between the subpixel SP and the dummy subpixel DS which are adjacent to each other, and are formed in a lattice shape as a whole. The feed lines FL1, FL2 and FL3 shown in FIG. 3 are the feed lines FLy.

The partitions PT correspond to dotted regions in the drawing. The partitions PT include a partition PTx extending in the first direction X and a partition PTy extending in the second direction Y. The partitions PT1, PT2, PT3 and PT4 shown in FIG. 3 are the partitions PTy.

The partitions PTy are arranged on the feed lines FLy. The endmost partition PTy in the first direction X overlaps the conductive layer CL1. The partitions PTx are arranged on the feed lines FLx, and are continuous with the adjacent partitions PTy between the subpixels SP1 and SP2 arranged in the second direction Y and between the dummy subpixels DS1 and DS2 arranged in the second direction Y. The partitions PTx are not arranged between the subpixels SP3 arranged in the second direction Y and between the dummy subpixels DS3 arranged in the second direction Y. The endmost partition PTx in the second direction Y extends longer than the other partitions PTx so as to overlap the conductive layer CL1, and is continuous with all the partitions PTy.

For example, the conductive layers CL1, CL2 and CL3 are formed in an annular shape in the surrounding region SA. The dummy subpixels DS1, DS2 and DS3 are located between the display region DA and the conductive layers CL1, CL2 and CL3. The feed lines FLx and FLy are connected to the conductive layer CL1.

In the example of FIG. 6, a large number of contact holes CH1 and CH2 are formed around the dummy subpixels DS1, DS2 and DS3. The contact holes CH1 are located closer to the display region DA than the contact holes CH2. As another example, the contact hole CH1 may have such a long shape that the contact holes CH1 arranged in the first direction X or the contact holes CH1 arranged in the second direction Y in FIG. 6 are connected together. Similarly, the contact hole CH2 may have such a long shape that the contact holes CH2 arranged in the first direction X or the contact holes CH2 arranged in the second direction Y in FIG. 6 are connected together.

As shown by a dashed line in FIG. 6, the common electrode CE is arranged in a region including the subpixels SP1, SP2 and SP3 and the dummy subpixels DS1, DS2 and DS3. The edge of the common electrode CE is located between the contact holes CH1 and CH2.

Although the cross-sectional structures along the first direction X of the subpixel SP3 and the dummy subpixels DS1 and DS3 are shown in FIG. 3, the cross-sectional structures along the first direction X of the subpixels SP1 and SP2 are the same as the subpixel SP3, and the cross-sectional structure along the first direction X of the dummy subpixel DS2 is the same as the dummy subpixel DS1. In addition, the cross-sectional structures along the second direction Y of the subpixels SP1 and SP2 are the same as the cross-sectional structure of the subpixel SP3 in FIG. 3, and the cross-sectional structures along the second direction Y of the dummy subpixels DS1 and DS2 are the same as the cross-sectional structure of the dummy subpixel DS1 in FIG. 3.

Among the elements arranged in each subpixel SP in the display region DA, for example, the pixel electrode PE1 is patterned by etching. When a plurality of elements are formed simultaneously by etching like this, the outermost peripheral part of these elements may be excessively eroded. Therefore, if there is no conductive layer equivalent to the pixel electrode PE1 outside the outermost peripheral pixel electrode PE1 in the display region DA, the configuration as designed cannot be obtained in the pixel PX including the outermost peripheral pixel electrode PE1, and display quality may be reduced.

On the other hand, in the present embodiment, the dummy pixel DP including the pixel electrode PE2 having the same shape as the pixel electrode PE1 is arranged outside the outermost peripheral pixel PX in the display region DA. Therefore, excessive erosion is less likely to occur in the pixel electrode PE1 of the outermost peripheral pixel PX, and consequently the display quality of the display device DSP can be improved.

In addition, when the partition PT having the reverse tapered shape as shown in FIG. 3 is arranged between the subpixel SP and the dummy subpixel DS, since the common electrode CE is divided by this partition PT, it is necessary to contrive a structure for feeding the common electrode CE arranged in the subpixel SP. In this respect, according to a structure where the feed line FL is arranged below the partition PT and the feed line FL is connected to the common electrode CE as described using FIGS. 3 and 6, voltage can be applied to the common electrode CE of each subpixel SP as desired.

Various other desired effects can be obtained from the present embodiment.

Second Embodiment

The second embodiment will be described. Unless otherwise noted, the configuration is the same as the first embodiment.

Figure 7:
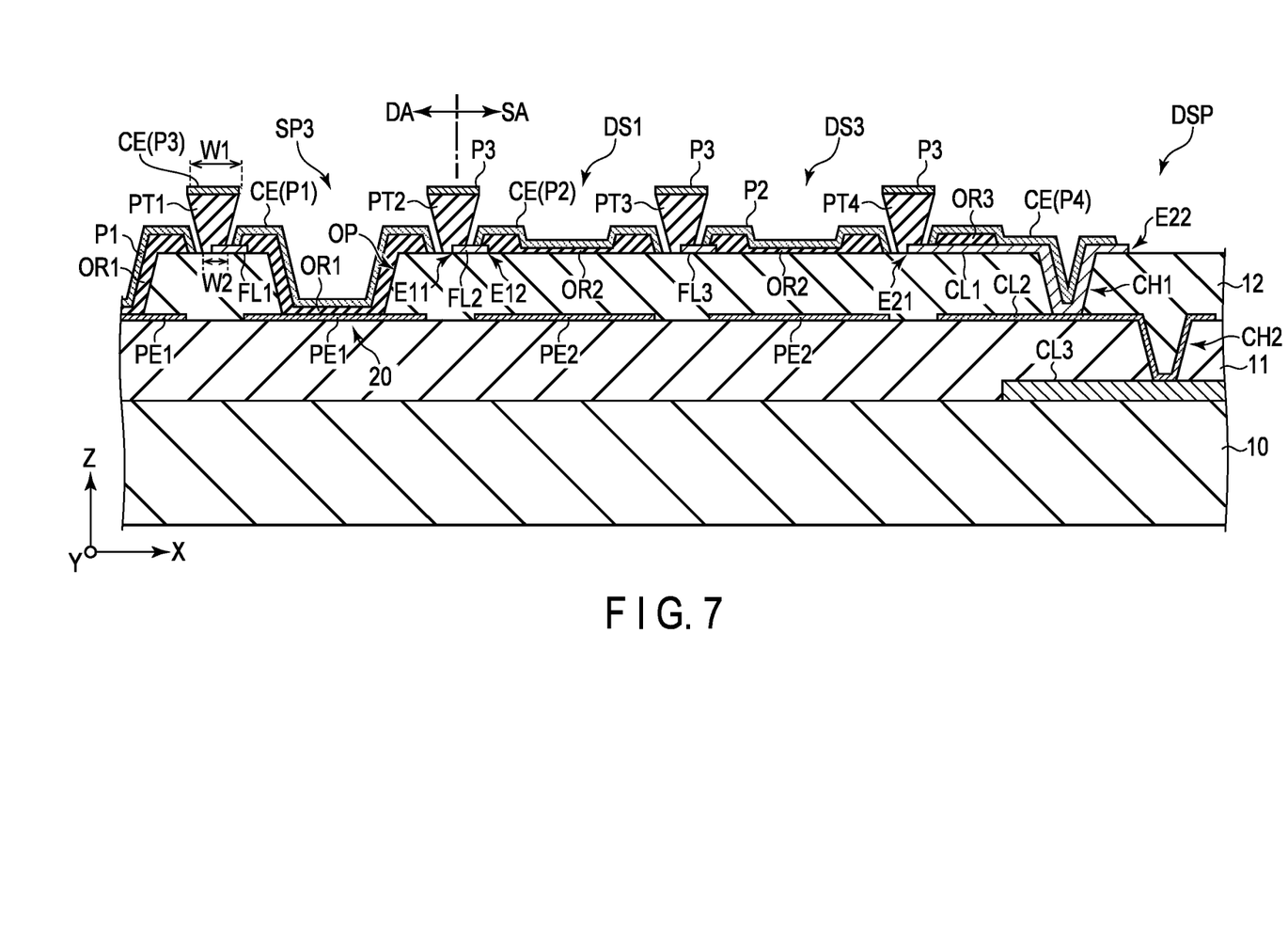
FIG. 7 is a schematic cross-sectional view of a display device according to the second embodiment.

FIG. 7 is a schematic cross-sectional view of the display device DSP according to the present embodiment. In the example of this drawing, one end part of the feed line FL is covered with the partition PT. That is, when attention is focused on, for example, the second feed line FL2, the first end part E11 is covered with the partition PT2, and the second end part El2 is not covered with the partition PT2. The same applies to the relationship between the feed line FL1 and the partition PT1 and the relationship between the feed line FL3 and the partition PT3. In addition, in the example of FIG. 7, the first end part E21 of the conductive layer CL1 is covered with the partition PT4, and the second end part E22 is not covered with the partition PT4.

The first part P1 of the common electrode CE which covers the organic layer OR1 of the subpixel SP3 is in contact with the feed line FL1 through a gap between the partition PT1 and the organic layer OR1. Since the first end part E11 of the feed line FL2 is covered with the partition PT2, this first part P1 is not in contact with the feed line FL2. The other subpixels SP have the same structure as the subpixel SP3 shown in FIG. 7.

The second part P2 of the common electrode CE which covers the organic layer OR2 of the dummy subpixel DS1 is in contact with the feed line FL2 through a gap between the partition PT2 and the organic layer OR2 but is not in contact with the feed line FL3. In addition, the second part P2 covering the organic layer OR2 of the dummy subpixel DS3 is in contact with the feed line FL3 through a gap between the partition PT3 and the organic layer OR2 but is not in contact with the conductive layer CL1. The other dummy subpixels DS have the same structure as the dummy subpixel DS1 or the dummy subpixel DS3 shown in FIG. 7.

As described above, in the present embodiment, two first parts P1 arranged in the adjacent subpixels SP are not connected via the feed line FL located therebetween. Similarly, the first part P1 and the second part P2 arranged in the subpixel SP and the dummy subpixel DS which are adjacent to each other or two second parts P2 arranged in the adjacent dummy subpixels DS are not connected via the feed line FL located therebetween. Although the cross section along the first direction X is described in FIG. 7, the same applies to the cross section along the second direction Y.

As in the above example of FIG. 3, when the first parts P1 arranged in the adjacent subpixels SP are connected via the feed line FL, current flowing to the display element 20 of one subpixel SP may leak into the display element 20 of the other subpixel SP. Such a leak between the subpixels SP may cause a display defect or an increase in the drive power of the display device DSP. On the other hand, according to the structure of the present embodiment, a leak of current between the display elements 20 of the adjacent subpixels SP can be suppressed.

In each of the above embodiments, the layout and configuration of the pixel PX and the dummy pixel DP are not limited those which are shown in FIGS. 1 and 2. For example, in each pixel PX, the subpixels SP (SP1, SP2 and SP3) having the same shape may be arranged in the first direction X. Similarly, in the dummy pixel DP, the dummy subpixels DS (DS1, DS2 and DS3) having the same shape may be arranged in the first direction X. In FIGS. 1 and 2, the dummy pixels DP are arranged around the display region DA only one time. However, the dummy pixels DSP may be arranged two or more times.

FIG. 7 illustrates a configuration in which the first end part E11 of the feed line FL2 is covered with the partition PT2 but the second end part E12 is not covered with the partition PT2. As another example, the first end part E11 may not be covered with the partition PT2, but the second end part El2 may be covered with the partition PT2. The relationship between the other feed line FL and the partition PT may be changed in the same manner.

FIGS. 3 and 7 illustrate a configuration in which the second part P2 arranged in the dummy subpixel DS is connected to the feed line FL. As another example, the second part P2 may not be connected to any feed line FL. In that case, the second part P2 is floating.

All display devices, which are implementable with arbitrary changes in design by a person of ordinary skill in the art based on the display devices described above as the embodiments of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be arbitrarily made to the above embodiments by a person of ordinary skill in the art, and these modifications also fall within the scope of the present invention as long as they encompass the spirit of the present invention.

In addition, the other advantages of the aspects described in the above embodiments, which are obvious from the descriptions of the specification or which are arbitrarily conceivable by a person of ordinary skill in the art, are considered to be achievable by the present invention as a matter of course.

What is claimed is:

1. A display device comprising:
 a substrate;
 a first insulating layer arranged on the substrate;
 a first pixel electrode arranged on the first insulating layer in a pixel located in a display region;
 a second pixel electrode arranged on the first insulating layer in a dummy pixel located in a surrounding region outside the display region;
 a second insulating layer arranged on the first insulating layer, and having an opening overlapping the first pixel electrode;
 a first organic layer arranged in the pixel, and being in contact with the first pixel electrode through the opening;
 a second organic layer arranged in the dummy pixel;
 a first feed line and a second feed line arranged on the second insulating layer;
 a first partition arranged on the first feed line;
 a second partition arranged on the second feed line; and
 a common electrode including a first part covering the first organic layer and a second part covering the second organic layer, wherein
 the first organic layer is located between the first partition and the second partition, and is separated from the first partition and the second partition,
 the second feed line and the second partition are located between the first organic layer and the second organic layer,
 the first partition and the second partition each are shaped such that a width of an upper part is greater than a width of a lower part, and
 the first part is in contact with the first feed line between the first partition and the first organic layer.

2. The display device of claim 1, wherein
 the second organic layer is separated from the second partition, and
 the second part is in contact with the second feed line between the second partition and the second organic layer.

3. The display device of claim 2, wherein the first part is in contact with the second feed line between the second partition and the first organic layer.

4. The display device of claim 1, wherein the first part is not in contact with the second feed line.

5. The display device of claim 4, wherein
 the second feed line has a first end part close to the first organic layer and a second end part close to the second organic layer,
 the first end part is covered with the second partition, and
 the second end part is not covered with the second partition.

6. The display device of claim 1, wherein
 the common electrode further includes a third part arranged on each of the upper parts of the first partition and the second partition, and
 the third part is separated from the first part and the second part.

7. The display device of claim 1, further comprising:
 a first conductive layer arranged on the second insulating layer in the surrounding region, and connected to the first feed line and the second feed line; and
 a second conductive layer arranged between the first insulating layer and the second insulating layer in the surrounding region, wherein
 the second insulating layer has a first contact hole in the surrounding region, and
 the first conductive layer is in contact with the second conductive layer through the first contact hole.

8. The display device of claim 7, further comprising a third conductive layer arranged between the substrate and the first insulating layer in the surrounding region, wherein
 the first insulating layer has a second contact hole in the surrounding region, and
 the second conductive layer is in contact with the third conductive layer through the second contact hole.

9. The display device of claim 7, wherein
 the common electrode further includes a fourth part arranged in the surrounding region, and
 the fourth part covers the first conductive layer.

10. The display device of claim 9, further comprising a third organic layer arranged on the first conductive layer, wherein
 the fourth part covers the third organic layer.

11. A display device comprising:
 a substrate;
 a first insulating layer arranged on the substrate;

a first pixel electrode arranged on the first insulating layer in a pixel located in a display region;
a second pixel electrode arranged on the first insulating layer in a dummy pixel located in a surrounding region outside the display region;
a second insulating layer arranged on the first insulating layer, and having an opening overlapping the first pixel electrode;
a first organic layer arranged in the pixel, and being in contact with the first pixel electrode through the opening;
a second organic layer arranged in the dummy pixel;
a first feed line and a second feed line arranged on the second insulating layer;
a first partition arranged on the first feed line;
a second partition arranged on the second feed line; and
a common electrode including a first part covering the first organic layer and a second part covering the second organic layer, wherein
the first organic layer is located between the first partition and the second partition, and is separated from the first partition and the second partition,
the second feed line and the second partition are located between the first organic layer and the second organic layer,
the first partition and the second partition each are shaped such that a width of an upper part is greater than a width of a lower part,
the first part is in contact with the first feed line between the first partition and the first organic layer, and
the first part is in contact with the second feed line between the second partition and the first organic layer.

12. The display device of claim 11, wherein
the common electrode further includes a third part arranged on each of the upper parts of the first partition and the second partition, and
the third part is separated from the first part and the second part.

13. The display device of claim 12, further comprising:
a first conductive layer arranged on the second insulating layer in the surrounding region, and connected to the first feed line and the second feed line; and
a second conductive layer arranged between the first insulating layer and the second insulating layer in the surrounding region, wherein
the second insulating layer has a first contact hole in the surrounding region, and
the first conductive layer is in contact with the second conductive layer through the first contact hole.

14. The display device of claim 13, further comprising a third conductive layer arranged between the substrate and the first insulating layer in the surrounding region, wherein
the first insulating layer has a second contact hole in the surrounding region, and
the second conductive layer is in contact with the third conductive layer through the second contact hole.

15. A display device comprising:
a substrate;
a first insulating layer arranged on the substrate;
a first pixel electrode arranged on the first insulating layer in a pixel located in a display region;
a second pixel electrode arranged on the first insulating layer in a dummy pixel located in a surrounding region outside the display region;
a second insulating layer arranged on the first insulating layer, and having an opening overlapping the first pixel electrode;
a first organic layer arranged in the pixel, and being in contact with the first pixel electrode through the opening;
a second organic layer arranged in the dummy pixel;
a first feed line and a second feed line arranged on the second insulating layer;
a first partition arranged on the first feed line;
a second partition arranged on the second feed line; and
a common electrode including a first part covering the first organic layer and a second part covering the second organic layer, wherein
the first organic layer is located between the first partition and the second partition, and is separated from the first partition and the second partition,
the second feed line and the second partition are located between the first organic layer and the second organic layer,
the first partition and the second partition each are shaped such that a width of an upper part is greater than a width of a lower part, and
the second feed line has a first end part close to the first organic layer and a second end part close to the second organic layer, the first end part is covered with the second partition, and the second end part is not covered with the second partition.

16. The display device of claim 15, wherein
the common electrode further includes a third part arranged on each of the upper parts of the first partition and the second partition, and
the third part is separated from the first part and the second part.

17. The display device of claim 16, further comprising:
a first conductive layer arranged on the second insulating layer in the surrounding region, and connected to the first feed line and the second feed line; and
a second conductive layer arranged between the first insulating layer and the second insulating layer in the surrounding region, wherein
the second insulating layer has a first contact hole in the surrounding region, and
the first conductive layer is in contact with the second conductive layer through the first contact hole.

18. The display device of claim 17, further comprising a third conductive layer arranged between the substrate and the first insulating layer in the surrounding region, wherein
the first insulating layer has a second contact hole in the surrounding region, and
the second conductive layer is in contact with the third conductive layer through the second contact hole.

* * * * *